United States Patent
Li et al.

(10) Patent No.: US 7,705,445 B2
(45) Date of Patent: Apr. 27, 2010

(54) SEMICONDUCTOR PACKAGE WITH LOW AND HIGH-SPEED SIGNAL PATHS

(75) Inventors: Ming Li, Fremont, CA (US); Sayeh Khalili, San Jose, CA (US); Donald R. Mullen, Mountain View, CA (US)

(73) Assignee: Rambus Inc., Los Altos, CA (US)

( * ) Notice: Subject to any disclaimer, the term of this patent is extended or adjusted under 35 U.S.C. 154(b) by 5 days.

(21) Appl. No.: 11/056,535

(22) Filed: Feb. 11, 2005

(65) Prior Publication Data
US 2006/0180902 A1 Aug. 17, 2006

(51) Int. Cl.
*H01L 23/14* (2006.01)
(52) U.S. Cl. ................. 257/700; 257/774; 257/E23.067
(58) Field of Classification Search ................. 257/687, 257/690, 700, E23.011, E23.067, 774
See application file for complete search history.

(56) References Cited

U.S. PATENT DOCUMENTS

| | | | |
|---|---|---|---|
| 3,893,072 A | 7/1975 | D'Antonio et al. | 340/146.1 |
| 3,980,993 A | 9/1976 | Bredart et al. | 340/172.5 |
| 4,725,878 A * | 2/1988 | Miyauchi et al. | 257/664 |
| 5,502,733 A | 3/1996 | Kishi et al. | 371/32 |
| 5,854,534 A * | 12/1998 | Beilin et al. | 257/691 |
| 6,121,676 A * | 9/2000 | Solberg | 257/686 |
| 6,232,655 B1 | 5/2001 | Sugimura | |
| 6,353,255 B2 | 3/2002 | Miyazaki et al. | |
| 6,514,794 B2 * | 2/2003 | Haba et al. | 438/109 |
| 6,624,005 B1 * | 9/2003 | DiCaprio et al. | 438/113 |
| 6,812,575 B2 | 11/2004 | Furusawa | |
| 6,995,465 B2 * | 2/2006 | Zhong et al. | 257/692 |
| 2003/0067064 A1 | 4/2003 | Kim | |
| 2003/0205802 A1 | 11/2003 | Seagram et al. | |
| 2003/0214802 A1 | 11/2003 | Fjelstad et al. | |
| 2004/0094328 A1 | 5/2004 | Fjelstad et al. | |

OTHER PUBLICATIONS

A. Medvedev and Kirill Budankov, NVIDIA GeForce 6800 Ultra (NV40). Part One: "Architecture Features and Synthetic Test in D3D RightMark," Apr. 26, 2004, p. 29.

* cited by examiner

*Primary Examiner*—Lynne A Gurley
*Assistant Examiner*—Colleen A Matthews
(74) *Attorney, Agent, or Firm*—Morgan, Lewis & Bockius LLP

(57) ABSTRACT

The semiconductor package includes two electrical contacts and a semiconductor device coupled to opposing sides of a substrate. The substrate defines at least one via extending at least partially there through. The semiconductor device includes a semiconductor low-speed interface electrically coupled to one of the electrical contacts through the via, and a semiconductor high-speed interface electrically coupled to flexible tape. The flexible tape is also electrically coupled to the other one of the electrical contacts.

66 Claims, 8 Drawing Sheets

SEMICONDUCTOR PACKAGE WITH LOW AND HIGH-SPEED SIGNAL PATHS

TECHNICAL FIELD

The embodiments disclosed herein relate to semiconductor devices, and in particular to a system and method for differentially routing high and low-speed signals between a semiconductor and a motherboard.

BACKGROUND

As computer systems evolve, so does the demand for increased speed and performance. Since semiconductor packages (also known as integrated circuit (IC) or chip packages) continue to have a significant effect on system performance, packaging design has also continued to evolve to keep pace with the demand for increased performance. In fact, as system frequency and edge-rate speeds increase, package effects have become increasingly significant. These package effects present system designers with numerous challenges when designing packages. For example, system designers need to take into consideration: trace impedance, crosstalk, skew and mostly impedance discontinuities at the semiconductor-to-substrate interface, at the substrate itself and at the substrate-to-PCB (printed circuit board) interface.

The semiconductor-to-substrate interface in ball grid array (BGA) packages is usually made via bonding wires or flip-chip bumps. This creates impedance discontinuities at the semiconductor-to-substrate interface, which may be minimized with lower bump heights or shorter wire lengths. Similarly, solder balls at the substrate-to-PCB board interface also cause impedance discontinuities, which may be controlled using anti-pads on the substrate and/or PCB. However, these lower bump heights, shorter wire lengths or anti-pads increase design complexity and may not be suitable for some package constructions.

Furthermore, vias and dielectric materials used in conventional, low cost, laminate substrates also create problems for high-speed signaling. For example, through-hole vias that extend through multi-layer substrates often form unused portions or stubs that add parasitic capacitance and produce signal reflections, both of which degrade signal quality. Although back-drilling and other techniques may be used to reduce the stub portions of the vias, such efforts further increase manufacturing costs and may not be suitable or possible for some package constructions. More recently, ceramic substrates with smaller vias or substrates with controllable build-up layers and smaller vias have been used in BGA packages to control the impedance discontinuities for high-speed signals. However, these new substrates are usually very expensive. Accordingly, current substrates are either lost cost with low performance or high cost with high performance. Accordingly, a high performance, but low cost, substrate to be used in a semiconductor package would be highly desirable.

Moreover, as current package designs may include both high-speed and low-speed signals, not all of the signals require the detailed design attention given to high-speed signals. Accordingly, a system that only addresses package effects for high-speed signals would be highly desirable.

BRIEF DESCRIPTION OF THE DRAWINGS

For a better understanding of the nature and objects of the invention, reference should be made to the following detailed description taken in conjunction with the accompanying drawings, in which.

Like reference numerals refer to the same or similar components throughout the several views of the drawings.

DETAILED DESCRIPTION OF THE EMBODIMENTS

The following description details various semiconductor packages. In some embodiments, the semiconductor package includes a substrate, at least one electrical contact, a semiconductor device and at least one flexible conductor. The substrate has a substrate first side and an opposing substrate second side. At least one electrical contact is mechanically coupled to the substrate at the substrate first side, while the semiconductor device is mechanically coupled to the substrate at the substrate second side. In some embodiments, the electrical contacts are solder balls, solder lands or pins.

At least one flexible conductor is electrically coupled to the semiconductor device and to the at least one electrical contact. In some embodiments, the semiconductor package also includes at least one electrical trace on the substrate second side. In these embodiments the semiconductor device and at least one flexible conductor are electrically coupled to at least one electrical trace. The semiconductor device may also be electrically coupled to the electrical contacts through one or more vias passing through the substrate from the substrate second side to the substrate first side.

The various semiconductor packages all treat low-speed and high-speed signals separately. For example, the low-speed signals travel from a semiconductor low-speed interface on the semiconductor device to one or more wire bonds; from the one or more wire bonds to one or more vias; from the vias to one or more solder balls; and from the solder balls to a PCB (and vice versa). Unlike the low-speed signals, the high-speed signals travel from a semiconductor high-speed interface on the semiconductor device to one or more wire bonds; from the wire bonds to one or more micro-strip conductors on the second side of the substrate; from the conductors to a flex-tape; and from the flex-tape to the solder balls (and vice versa). Therefore, the high-speed signals avoid passing through the vias, thereby reducing impedance discontinuities, parasitic capacitance and undesirable signal reflections caused by the vias. In some embodiments, the high speed signals are electric signals that travels at 1 GHz frequency or higher.

Figure 1:
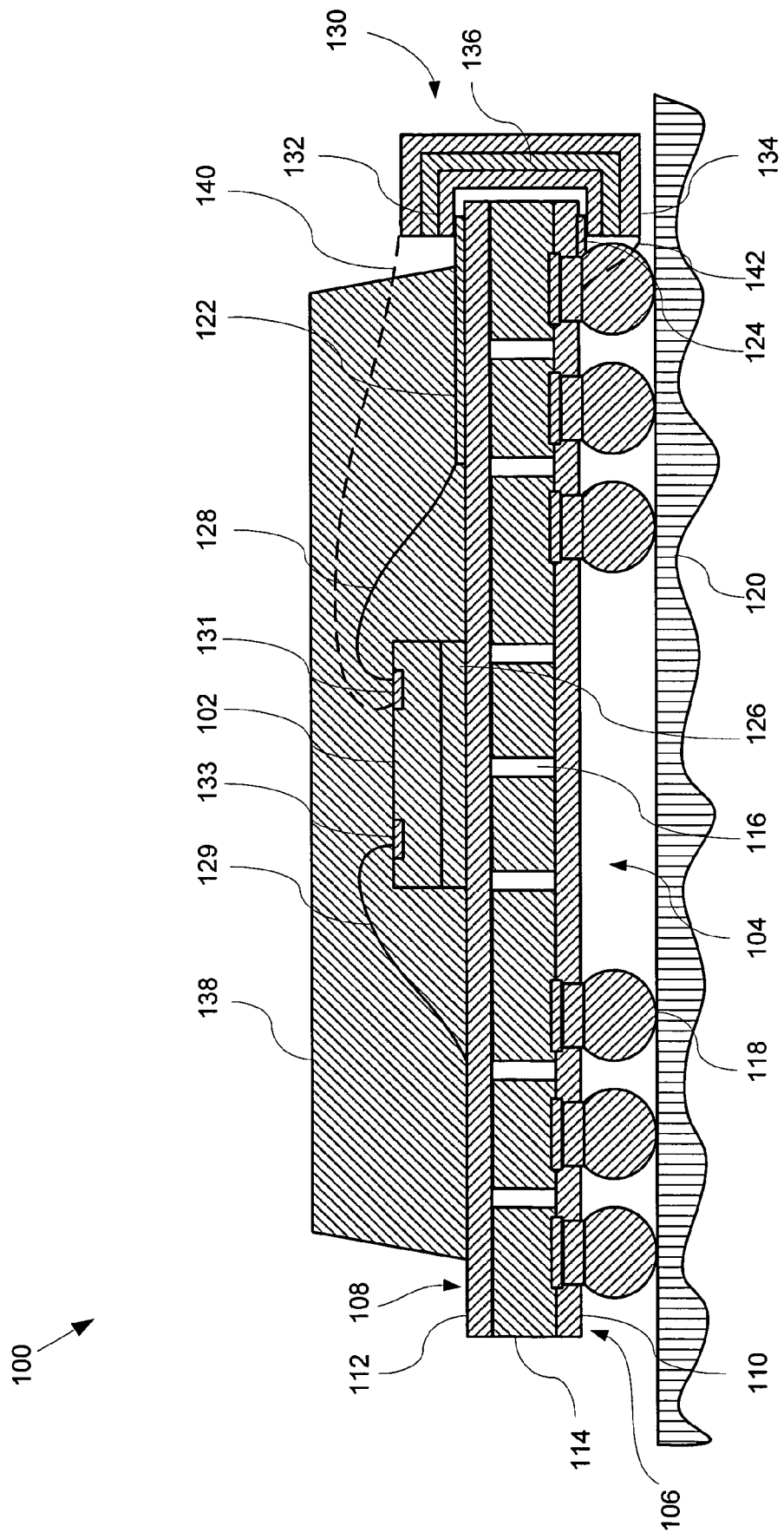
FIG. 1 is a cross-sectional side view of a semiconductor package, according to an embodiment of the invention.

FIG. 1 is a cross-sectional side view of a semiconductor package 100. The semiconductor package 100 includes a semiconductor device 102 mounted on a substrate 104. The substrate 104 is substantially planar and has a substrate first side 106 and an opposing substrate second side 108. In some embodiments the substrate 104 is a multi-layer laminate circuit board. In the embodiment shown in FIG. 1, the substrate has a substrate first conductive layer 110 separated from a substrate second conductive layer 112 by a substrate insulation layer 114. The substrate conductive layers 110, 112 may form trace patterns made from copper or the like. For example, at least one conductor or trace 122 may be formed at the substrate second side 108 and at least one conductor or trace 124 may be formed at the substrate first side 106.

The insulation layer may be made from FR4 (Flame Retardant 4) or the like. In addition, one or more vias 116 may form conducting pathways at least partially through the substrate, e.g., to electrically couple the first and second conductive layers 110, 112. The vias may be formed by any suitable technique, such as by drilling through the board at the appropriate place where two or more layers interconnect and allowing copper to run through the hole. The copper may coat only the sides of the hole or fill the entire hole.

The semiconductor package may also include one or more electrical contacts 118 mechanically coupled to the substrate first side 106. In some embodiments, these electrical contacts may be an array of solder balls, solder lands or pins, where the solder balls provide contact between the semiconductor package and the printed circuit board. In the embodiment shown in FIG. 1, these electrical contacts 118 are electrically coupled to the substrate first conductive layer 110. When the semiconductor package 100 is installed, the electrical contacts 118 are electrically and/or mechanically coupled to a printed circuit board (PCB) 120.

Figure 5:
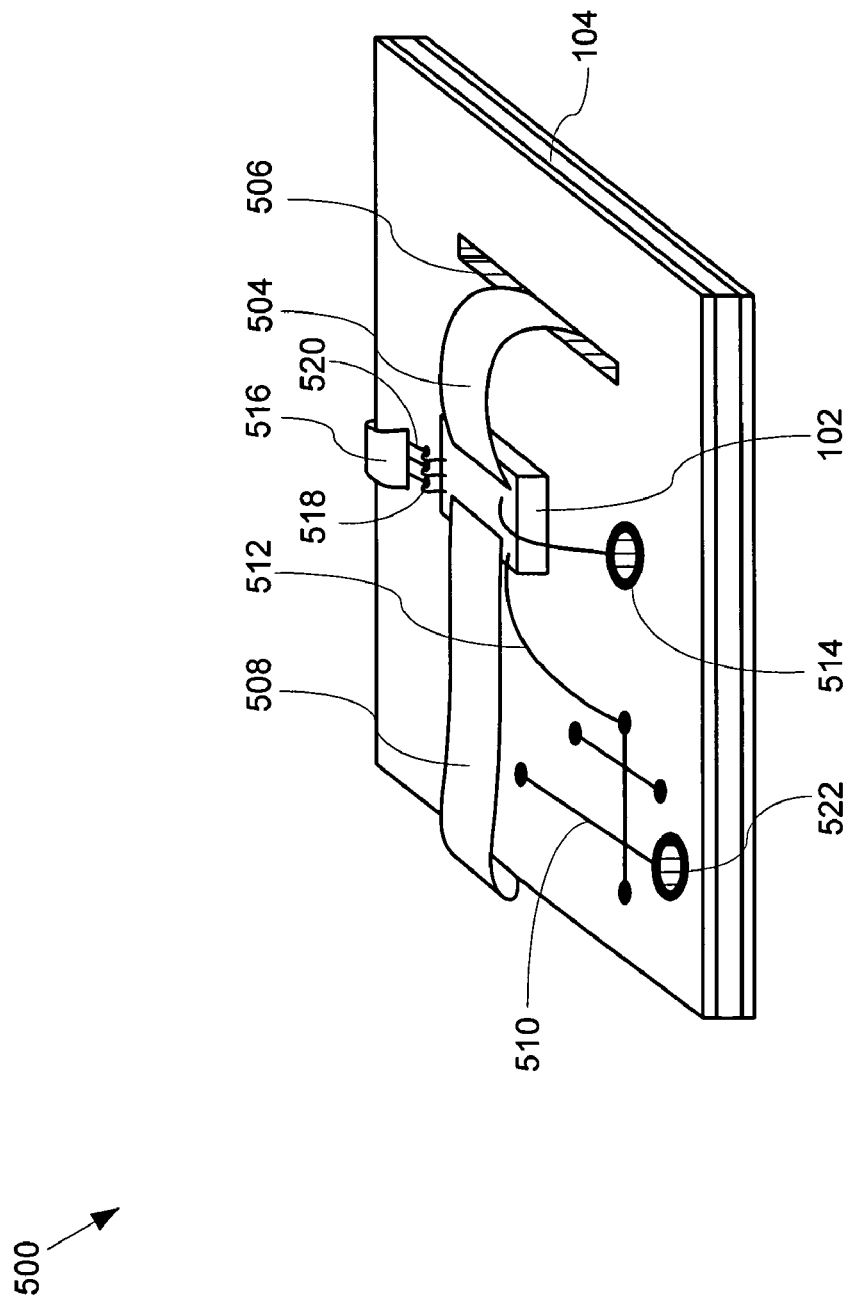
FIG. 5 is an oblique view of a further semiconductor package, according to a further embodiment of the invention.

The semiconductor device 102 is mechanically coupled to the substrate second side 108. In some embodiments, the semiconductor device 102 is mechanically coupled to the substrate second side 108 via a layer of die attach adhesive 126, which may or may not be thermally or electrically conductive depending on the specific application. In the embodiment shown in FIG. 1, a first wire bond 128 is electrically coupled to a semiconductor high-speed interface 131 of the semiconductor device. Similarly, a second wire bond 129 is electrically coupled to a semiconductor low-speed interface 133 of the semiconductor device. Wire bonds use metal wires (typically, Aluminum or Gold) that are bonded to the bare semiconductor device's electric contact pad at one end and to metal leads of the semiconductor package substrate at the other. An example of a wire bond 512 is shown in FIG. 5 electrically coupling a semiconductor device 102 to electrical traces or conductors 510 at the substrate second side 108 (FIG. 1).

In the embodiment shown in FIG. 1, at least one second wire bond 129 electrically couples the semiconductor low-speed interface 133 of the semiconductor device 102 to the substrate second conductive layer 112. At least part of the conductive layer 112 is in turn electrically coupled to one or more of the electrical contacts 118 through one or more of the vias 116. This electrical connection between the semiconductor device 102 and the electrical contacts 118 through the via allows low-speed signals to be routed through the vias, thereby allowing a low cost substrate to be used to route low-speed signals. Also in this embodiment, at least one first wire bond 128 electrically couples the semiconductor high-speed interface 131 of the semiconductor device 102 to the one or more traces or conductors 122 at the substrate second side 108.

Moreover, a flexible conductor 130 is coupled to the substrate first and second sides 106, 108, respectively. Although the flexible conductor 130 may be a single layer. In some embodiments, the flexible conductor 130 is a multi-layer flexible tape (flex-tape), as shown in FIG. 1. In this embodiment, the flexible conductor 130 includes a flexible conductor first conductive layer 132 separated from a flexible conductor second conductive layer 134 by a flexible conductor insulation layer 136. The flexible conductor insulation layer 136 may be any type of flexible insulation material, but in some embodiments will include a polyimide as its dielectric material. As compared to the dielectric material in the substrate insulation later 114 of the substrate 104, the polyimide in the flexible conductor has a lower dielectric constant and lower loss coefficient. Accordingly, the flexible conductor 130 has better impedance control with microstripline design.

In this embodiment, all three layers 132, 134, 136 of the flex-tape extend from the substrate first side 106 to the substrate second side 108. Also in this embodiment, the flexible conductor 130 wraps around at least one edge of the substrate 104. Accordingly, the flexible conductor 130 is bendable and able to be formed to fit around the edge of the substrate. This helps minimize the length of the flexible conductor 130, thereby decreasing any signal integrity losses. The flexible conductor 130 may be mechanically coupled to the substrate 104 using any suitable means, such as by bonding the flexible conductor to the substrate using an Anisotropic Conductive Adhesive (ACA) tape or by connecting the flexible conductor to the substrate with a mechanical clip.

In some embodiments, the flexible conductor first conductive layer 132 electrically couples the trace or conductor 122 at the substrate second side 108 to the trace or conductor 124 at the substrate first side 106. Accordingly, the semiconductor device is electrically coupled to the PCB 120 through the one or more wire bonds 128, trace 122, flexible conductor first conductive layer 132, trace 124, and one or more of the electrical contacts 118. This signal path is used to communicate high-speed signals between the semiconductor high-speed interface of the semiconductor device and the PCB 120. Accordingly, high-speed signals are routed through the flexible conductor 130 and not through the vias 116, thereby avoiding signal integrity problems associated with a signal path through the vias 116.

Figure 4:
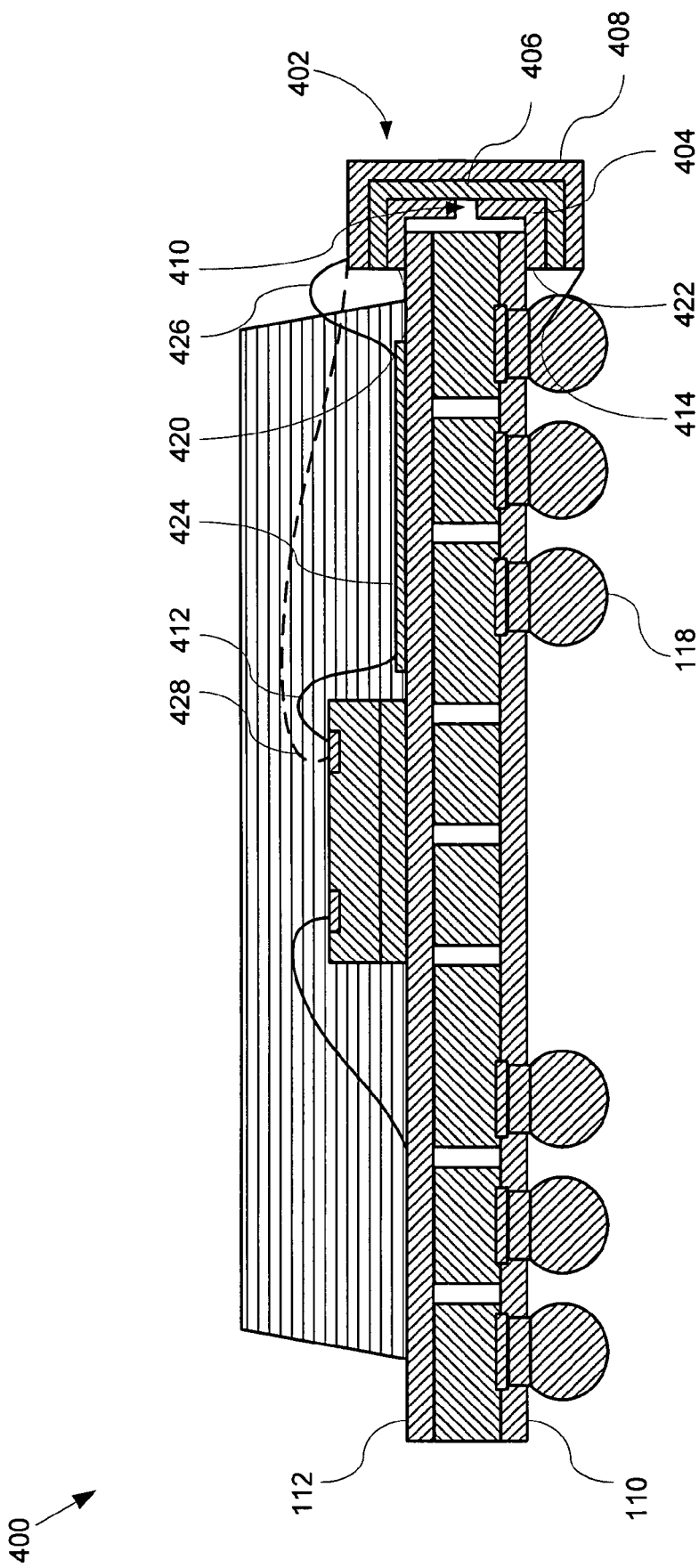
FIG. 4 is a cross-sectional side view of one other semiconductor package, according to one other embodiment of the invention.

In the embodiment shown, the flexible conductor second conductive layer 134 may be used as a ground plane. In an alternative embodiment, the flexible conductor first conductive layer 132 may act as a ground plane, while the flexible conductor second conductive layer 134 may be used to communicate the high-speed signal. In this embodiment, the flexible conductor second conductive layer 134 is electrically coupled to the semiconductor device 102 through a wire bond 140, and is electrically coupled to one or more of the electrical contacts 118 through another wire bond or other conductor 142. Alternatively, the semiconductor device may be wire bonded to a trace or conductor 420 at the substrate second side 108, which is in turn wire bonded to the flexible conductor second conductive layer 408, as shown in FIG. 4.

In yet another embodiment, both the flexible conductor first and second conductive layers 132, 134 may act as high-speed signal carriers. In a further embodiment, either of the flexible conductor first or second conductive layers 132, 134 may act as a ground plane, while the other layer acts as a high-speed signal carrier.

In some embodiments, the semiconductor device 102, wire bonds 128, 129 and at least part of the substrate second side 108 may be covered or encapsulated in a housing 138, such as with a molding compound. The housing may act as an insulator to protect the device and/or as a heat sink or spreader to dissipate the heat from the device.

In light of the above description, it can be seen that in some embodiments, high-speed signals travel from a semiconductor high-speed interface 131, along a bond wire to one or more traces on the substrate second conductive layer 112. The high-speed signals then travel from a conductive layer of the flexible conductor 130 to the edge of the substrate first side 106. Eventually, the high-speed signals travel to the PCB 120 through the nearest solder balls 118. In this way, the high-speed signals travel through the flexible conductor 130, avoiding travelling through the package substrate, with minimal impedance discontinuities.

Figure 2:
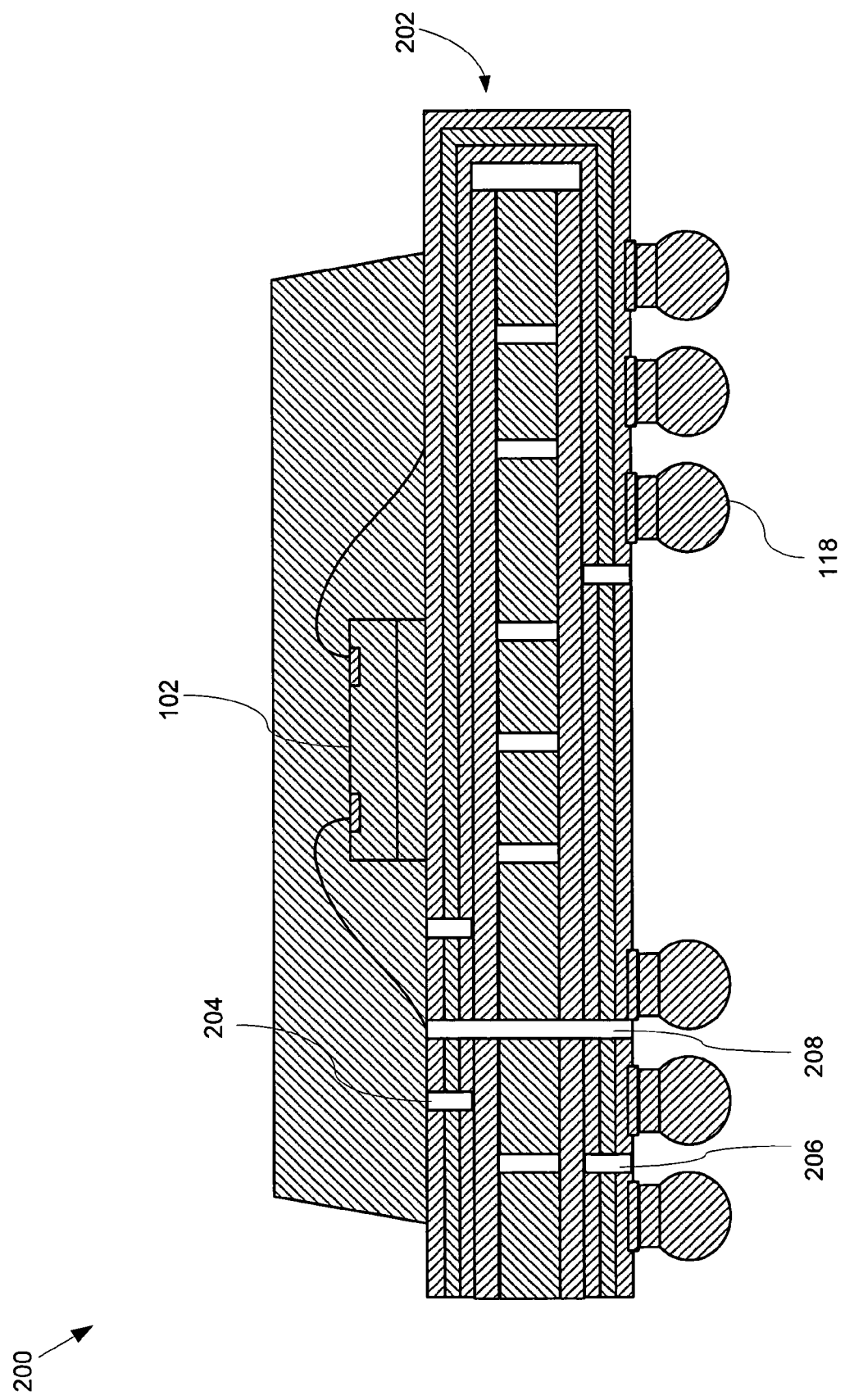
FIG. 2 is a cross-sectional side view of another semiconductor package, according to another embodiment of the invention.

FIG. 2 is a cross-sectional side view of another semiconductor package 200. This semiconductor package 200 is similar to the semiconductor package 100 shown in FIG. 1. However, this semiconductor package 200 includes a flexible conductor 202 that wraps entirely around the substrate, i.e., the flexible conductor extends substantially across the substrate first and second sides. In this embodiment, the semiconductor device 102 and the electrical contacts 118 are coupled to the flexible conductor 202 and not to the substrate, as is the case with the semiconductor package 100 shown in FIG. 1. Vias 204, 206 and 208 may extend through at least part of the substrate and/or the flexible conductor 202. As with the semiconductor package 100 shown in FIG. 1, low-speed signals travel through vias in the substrate and/or flexible conductor 202, while high-speed signals travel along a conductive layer of the flexible conductor around an edge of the substrate to one or more electrical contacts 118.

Figure 3:
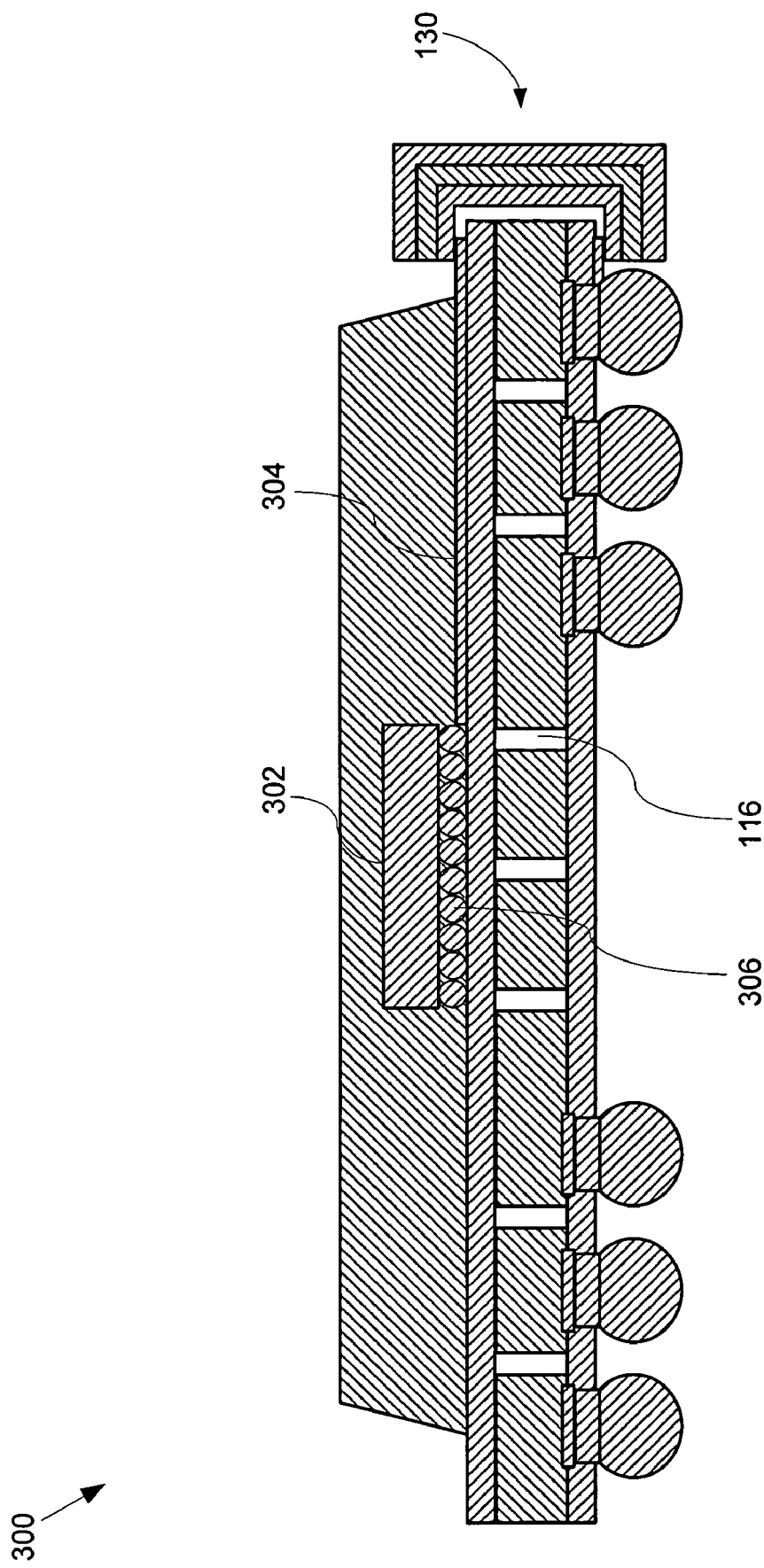
FIG. 3 is a cross-sectional side view of yet another semiconductor package, according to yet another embodiment of the invention.

FIG. 3 is a cross-sectional side view of yet another semiconductor package 300. This semiconductor package 300 is also similar to the semiconductor package 100 shown in FIG. 1. However, this semiconductor package 300 includes a flip-chip design, where the active area of the semiconductor device 302 is "flipped over" facing downward towards the substrate. Instead of facing up and using the wire bonds 128, 129 shown in FIG. 1, any surface area of the flip-chip can be used for interconnection, which is typically done through metal bumps or balls 306 of solder, copper, nickel, gold or their alloys. These balls or bumps 306 are soldered onto the substrate and underfilled with epoxy. The flip-chip allows for a large number of interconnects with shorter distances than wire, which greatly reduces inductance. At least some of the balls or bumps 306 are semiconductor high-speed interfaces that are electrically coupled to one or more of the electrical contacts through the flexible conductor 130 and one or more traces 304, while at least some of the balls or bumps 306 are semiconductor low-speed interfaces that are electrically coupled to one or more of the electrical contacts through one or more vias 116. Accordingly, as with the embodiments described above, high-speed signals travel through the flexible conductor 130 and not through the vias 116 in the substrate.

FIG. 4 is a cross-sectional side view of one other semiconductor package 400. This semiconductor package 400 is also similar to the semiconductor package 100 shown in FIG. 1. However, this semiconductor package 400 includes a flexible conductor 402, such as flex-tape, that has a flexible conductor first conductive layer 404 that is broken or not continuous. In particular, the flexible conductor first conductive layer 404 has a first portion 422 that is electrically coupled to a substrate first conductive layer 110, and a second portion 420 that is electrically coupled to a substrate second conductive layer 112. The first portion 422 and the second portion 420 are not electrically coupled to one another, e.g., they are separated by an insulator or an air gap 410. The flexible conductor 402 also includes a flexible conductor second conductive layer 408 separated from the first conductive layer by a flexible conductor insulation layer 406. The flexible conductor second conductive layer 408 is electrically coupled to the high-speed interface of the semiconductor device through a first wire bond 412, a trace 424 and a second wire bond 426. Alternatively, the flexible conductor second conductive layer 408 is electrically coupled to the high-speed interface of the semiconductor device directly through one or more wire bonds 428.

The flexible conductor second conductive layer 408 is also electrically coupled to one or more electrical contacts 118 though a second wire bond or conductor 414. In this embodiment, the substrate first conductive layer 110 acts as a power plane while the substrate second conductive layer 112 acts as a ground plane (and vice versa). This is possible as the flexible conductor first conductive layer 404 does not electrically couple the substrate first and second conductive layers to one another, because of the air-gap between the first and second portions 422, 420, respectively. As in the embodiments described above, high-speed communication between the semiconductor high-speed interface of the semiconductor device and the electrical contacts 118 occurs through a conductive layer of the flexible conductor 402.

FIG. 5 is an oblique view of a further semiconductor package 500. This semiconductor package 500 is similar to the semiconductor package 100 shown in FIG. 1. The semiconductor package 500 includes a semiconductor device 102 coupled to a substrate 104. As described above, the semiconductor device 102 may be electrically coupled to electrical contacts (not shown in this figure) via numerous means. For example, the semiconductor device 102 may be electrically coupled to traces 510 at the substrate second side through one or more wire bonds 512. These traces may then be electrically coupled to one or more vias 522 that may in turn electrically couple to electrical contacts at the substrate first side. Similarly, the semiconductor device 102 may be electrically coupled directly to one or more vias 514 also through one or more wire bonds.

Furthermore, the semiconductor device 102 may be electrically coupled to the electrical contacts through one or more wire bonds 518 that are electrically coupled to traces 520 on the substrate that are in turn electrically coupled to a flexible conductor 516. The flexible conductor 516 is electrically coupled to the electrical contacts. Similarly, the semiconductor device 102 may also be electrically coupled to the electrical contacts directly through a flexible conductor 508 that wraps around the edge of the substrate 104, without first being connected to a wire bond and/or traces. Alternatively, or in addition, the semiconductor device 102 may be electrically coupled to the electrical contacts through another flexible conductor 504 that passes through a slot 506 in the substrate 104. In other words, the flexible conductor 504 need only electrically couple the semiconductor device near the substrate second side to the electrical contacts near the substrate first side, and need not wrap around the edge of the substrate 104. Therefore, depending on the number of the high-speed signals, flexible conductors, such as flex-tape, may be electrically coupled to the semiconductor at multiple locations and may wrap around any or all edges of the substrate, as well as pass through slots in the substrate.

Figure 6:
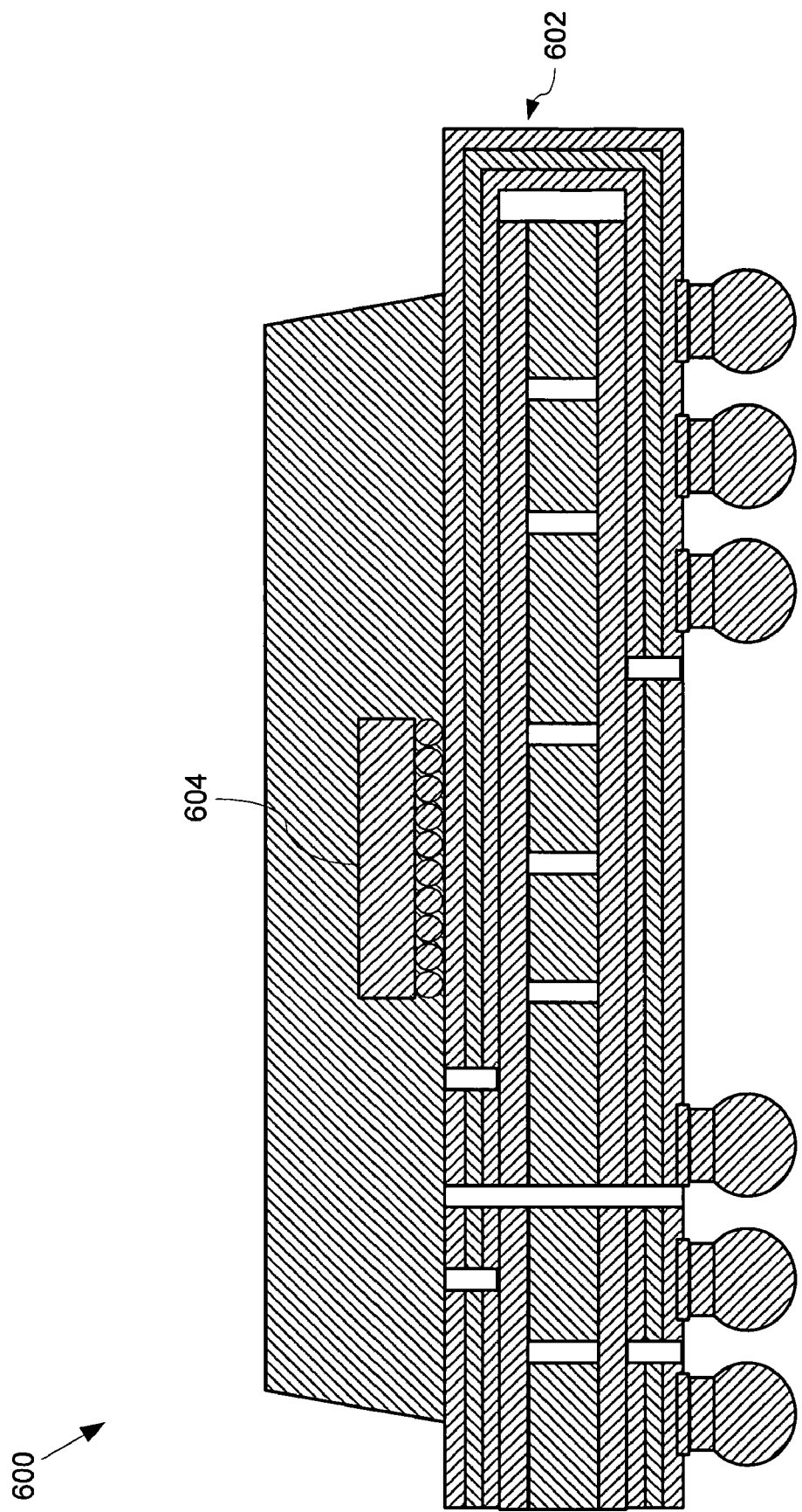
FIG. 6 is a cross-sectional side view of another semiconductor package, according to another embodiment of the invention.

FIG. 6 is a cross-sectional side view of another semiconductor package 600. This package is similar to the semiconductor packages 200 and 300 shown in FIGS. 2 and 3, respectively. The semiconductor package 600 includes a flexible conductor 602 that wraps entirely around the substrate, i.e., the flexible conductor extends substantially across the substrate first and second sides. The semiconductor package 600 also includes a flip-chip 604, similar to the flip-chip semiconductor device 302 shown in FIG. 3. Vias may extend through at least part of the substrate and/or the flexible conductor 602. As with the semiconductor packages described above, low-speed signals travel through vias in the substrate and/or flexible conductor 604, while high-speed signals travel along a conductive layer of the flexible conductor around an edge of the substrate to one or more electrical contacts.

Figure 7:
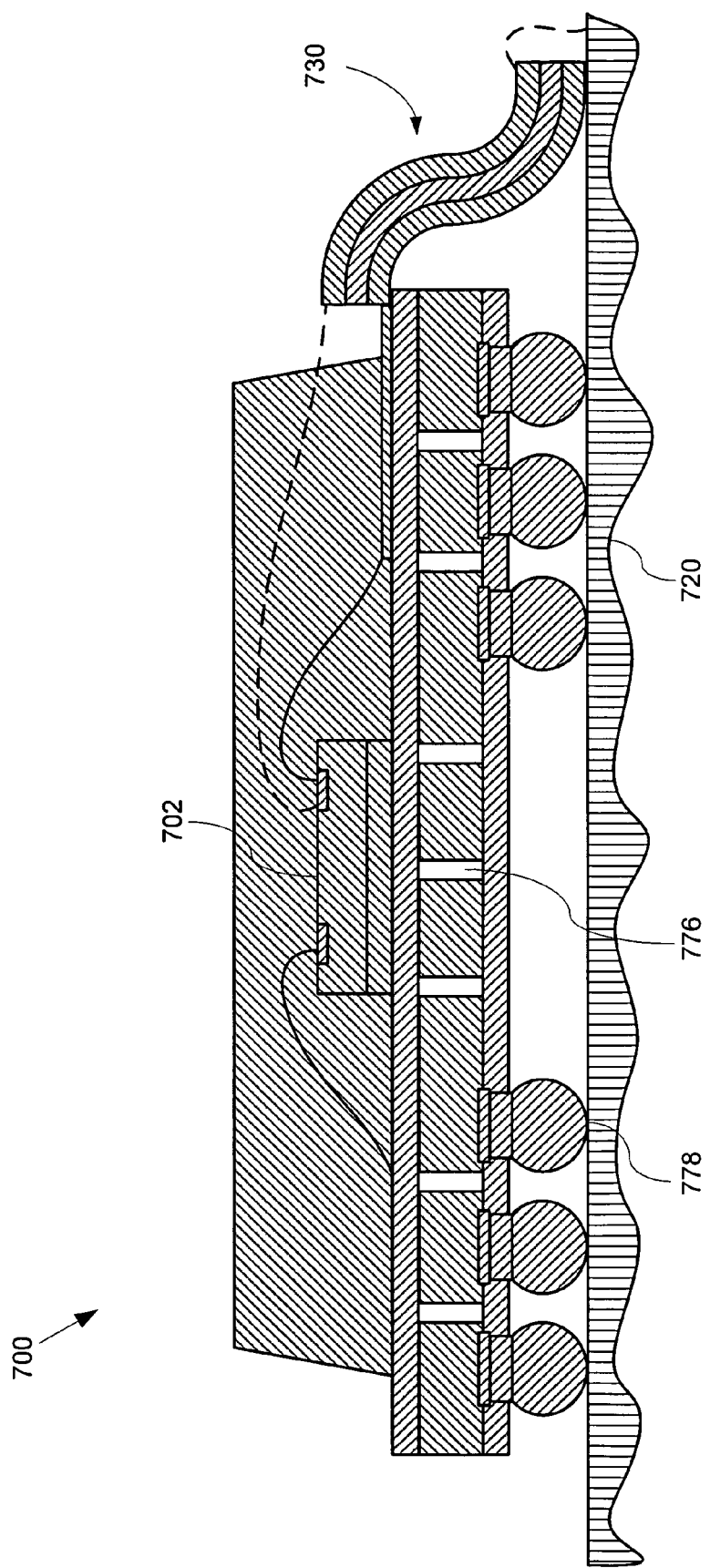
FIG. 7 is a cross-sectional side view of yet another semiconductor package, according to yet another embodiment of the invention.

FIG. 7 is a cross-sectional side view of yet another semiconductor package 700. This semiconductor package is similar to the semiconductor package 100 shown in FIG. 1. However, the semiconductor package 700 includes a flexible conductor 730, such as flex-tape, that electrically couples the semiconductor package 700 directly to a printed circuit board (PCB) 720, such as a motherboard. In other words, one end of the flexible conductor 730 is electrically and/or mechanically coupled to the substrate and the other end is electrically and/or mechanically coupled to the PCB 720. The flexible conductor 730 may be coupled to the PCB 720 by any suitable means, such as by being soldered directly onto the PCB 720 or electrically coupled to the PCB 720 via one or more further wire bonds.

As above, low-speed signals travel from the semiconductor device 702, through vias 776 in the substrate, and on to one or more electrical contacts 778. The high speed signals, however, travel from the semiconductor device 702, through one or more wire-bonds and/or electrical traces, through the flexible conductor, and then directly on to the PCB 720. This design further reduces any impedance discontinuities that may arise at the flexible conductor to electrical contact interface and at the electrical contact to PCB interface.

Figure 8:
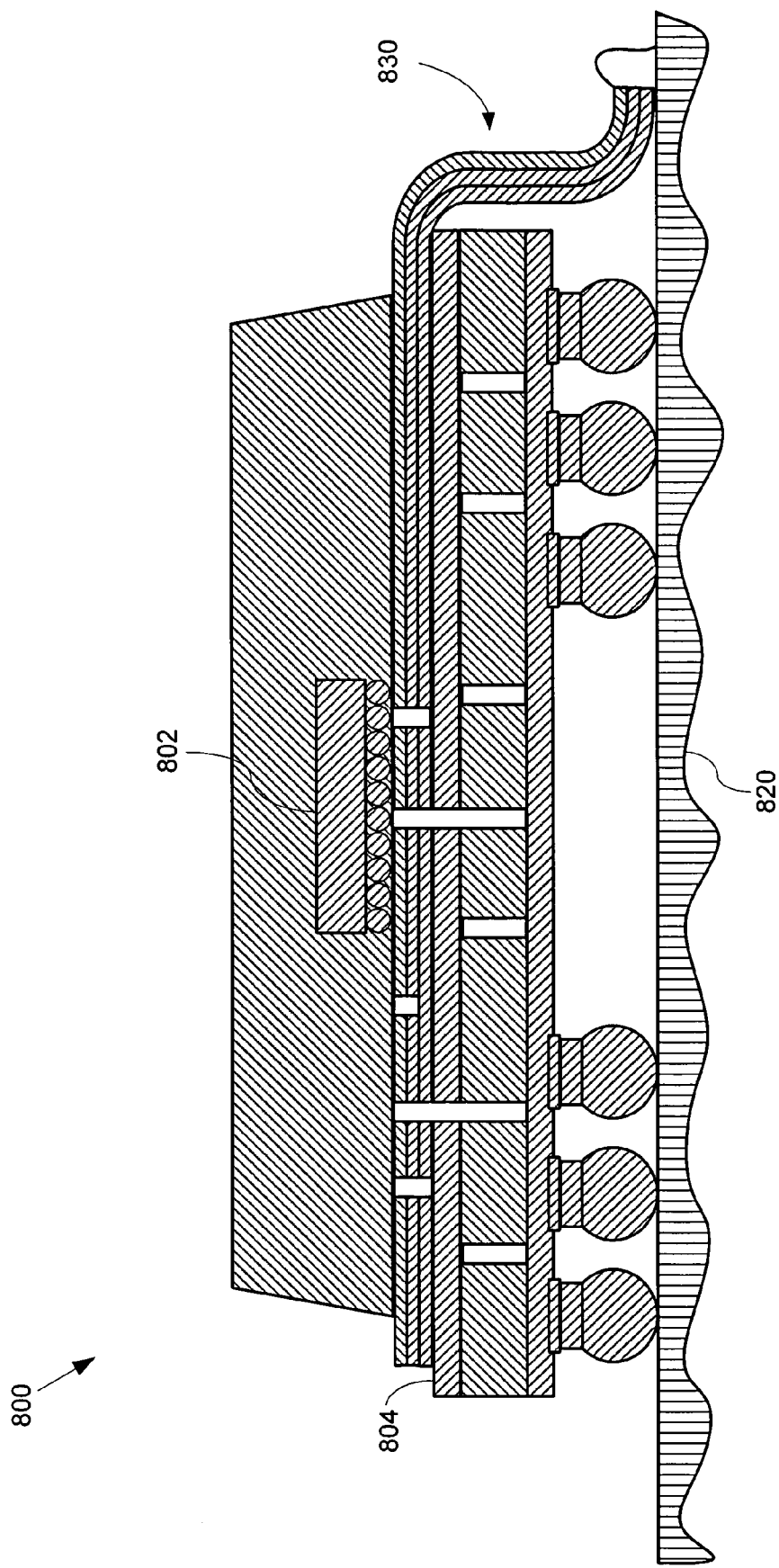
FIG. 8 is a cross-sectional side view of one other semiconductor package, according to one other embodiment of the invention.

FIG. 8 is a cross-sectional side view of yet another semiconductor package 800. This semiconductor package is similar to the semiconductor packages 300 and 700 shown in FIGS. 3 and 7 respectively. The semiconductor package 800 includes a flexible conductor 830 that extends substantially across the substrate first side 804. The semiconductor package 800 also includes a flip-chip 802, similar to the flip-chip semiconductor device 302 shown in FIG. 3. Vias may extend through at least part of the substrate and/or the flexible conductor 830.

The flexible conductor 830 electrically couples the semiconductor package 800 directly to a printed circuit board (PCB) 820, such as a motherboard. In other words, one end of the flexible conductor 830 is electrically and/or mechanically coupled to the substrate and the other end is electrically and/or mechanically coupled to the PCB 820. The flexible conductor 830 may be coupled to the PCB 820 by any suitable means, such as by being soldered directly onto the PCB 820 or electrically coupled to the PCB 820 via one or more further wire bonds.

As with the semiconductor package described above in relation to FIG. 7, low-speed signals travel from the semiconductor device 802, through vias in the substrate, and on to one or more electrical contacts. The high speed signals, however, travel from the semiconductor device 802, through the flexible conductor 830, and then directly on to the PCB 820. This design also reduces impedance discontinuities that may arise at the flexible conductor to electrical contact interface and at the electrical contact to PCB interface.

In one or more of the above described embodiments, both high speed and low or lower speed signals may be carried by one or more flexible conductors between a semiconductor device coupled to a second side of a substrate to electrical contacts on a first side of the substrate.

In further embodiments, the above mentioned semiconductor packages may be used in system-in-package (SiP) devices, e.g., where logical and memory devices are stacked within a single package.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. For example, the proportional difference in size of the semiconductor package with respect to the semiconductor devices may be different, such that the semiconductor package is a Chip Scale Package (CSP), where the semiconductor package is housing that is slightly larger than the semiconductor device itself. For example, the semiconductor package may be no larger than 1.2 times the size of the semiconductor device itself. The presently disclosed embodiments are therefore to be considered in all respects as illustrative and not restrictive, the scope of the invention being indicated by the appended claims, and not limited to the foregoing description.

What is claimed is:

1. A semiconductor package, comprising:
   a rigid circuit board substrate having a substrate first side and an opposing substrate second side;
   multiple electrical contacts coupled to said substrate at said substrate first side;
   an adhesive in direct contact with said substrate second side;
   a semiconductor device in direct contact with said adhesive; and
   at least one flexible conductor electrically coupled to a high-speed data interface of said semiconductor device and to at least one of said electrical contacts so as to establish a high-speed data signal path from said semiconductor high-speed data interface to said at least one of said electrical contacts without passing through a via in said rigid circuit board substrate.

2. The semiconductor package of claim 1, further comprising at least one electrical trace on said substrate second side, where said semiconductor device and said at least one flexible conductor are electrically coupled to said at least one electrical trace through one or more wire bonds.

3. The semiconductor package of claim 1, wherein said semiconductor device is electrically coupled to said at least one flexible conductor through one or more wire bonds.

4. The semiconductor package of claim 1, wherein said substrate is a multi-layer laminate circuit board.

5. The semiconductor package of claim 1, wherein said substrate has a substrate first conductive layer at said substrate first side and a substrate second conductive layer at said substrate second side, where said substrate first conductive layer and said substrate second conductive layer are separated by a substrate insulation layer.

6. The semiconductor package of claim 1, wherein said electrical contacts comprise an array of solder balls, solder lands or pins.

7. The semiconductor package of claim 1, wherein said at least one flexible conductor is mechanically coupled to said substrate.

8. The semiconductor package of claim 1, wherein said at least one flexible conductor is wrapped around an edge of said substrate between said substrate first side and said substrate second side.

9. The semiconductor package of claim 1, wherein said at least one flexible conductor is flexible tape (flex-tape).

10. The semiconductor package of claim 1, wherein said high-speed data interface and said high-speed data signal path are configured to communicate data signals at a frequency of 1 GHz or higher.

11. The semiconductor package of claim 1, wherein said substrate defines one or more vias extending at least partially there through.

12. The semiconductor package of claim 11, wherein said semiconductor device comprises at least one semiconductor low-speed data interface electrically coupled to at least one of said electrical contacts through at least one of said vias.

13. The semiconductor package of claim 1, wherein said flexible conductor comprises at least two flexible conductor conductive layers separated by a flexible conductor insulation layer.

14. The semiconductor package of claim 13, wherein at least one of said flexible conductor conductive layers is electrically coupled to said semiconductor device and to at least one of said electrical contacts.

15. The semiconductor package of claim 13, wherein at least one of said flexible conductor conductive layers acts as a ground plane.

16. A semiconductor package, comprising:
a rigid circuit board substrate having a substrate first side and an opposing substrate second side;
multiple electrical contacts coupled to said substrate at said substrate first side;
an adhesive in direct contact with said substrate second side;
a semiconductor device in direct contact with said adhesive; and
at least one flexible conductor electrically coupled to said semiconductor device and to at least one of said electrical contacts, wherein said flexible conductor comprises:
a flexible conductor first conductive layer electrically coupled to a semiconductor high-speed data interface of said semiconductor device and to at least one of said electrically contacts;
a flexible conductor second conductive layer configured to act as a ground plane; and
a flexible tape insulation layer separating said flexible conductor first conductive layer and said flexible conductor second conductive layer, wherein said flexible conductor forms a high-speed data signal path from said semiconductor high-speed data interface to said at least one of said electrical contacts without passing through a via in said rigid circuit board substrate.

17. The semiconductor package of claim 16, wherein said high-speed data interface and said high-speed data signal path are configured to communicate data signals at a frequency of 1 GHz or higher.

18. A semiconductor package, comprising:
a substrate defining:
a substrate first side and an opposing substrate second side; and
at least one via extending at least partially through said substrate;
at least first and second electrical contacts coupled to said substrate at said substrate first side;
a semiconductor device coupled to said substrate at said substrate second side, wherein said semiconductor device comprises:
a semiconductor low-speed data interface electrically coupled to said first electrical contact through said via; and
a semiconductor high-speed data interface; and
flexible tape electrically coupling said semiconductor high-speed data interface to said second electrical contact;
wherein the semiconductor package is configured to route a high-speed data signal between said second electrical contact and said semiconductor high-speed data interface without passing through a via in said substrate.

19. The semiconductor package of claim 18, wherein said semiconductor high-speed data interface is electrically coupled to said flexible tape through one or more wire bonds.

20. The semiconductor package of claim 18, wherein said substrate is a multi-layer laminate circuit board.

21. The semiconductor package of claim 18, wherein said substrate has a substrate first conductive layer at said substrate first side and a substrate second conductive layer at said substrate second side, where said substrate first conductive layer and said substrate second conductive layer are separated by a substrate insulation layer.

22. The semiconductor package of claim 18, wherein said first and second electrical contacts comprise an array of solder balls or bumps.

23. The semiconductor package of claim 18, wherein said semiconductor device is mechanically coupled to said substrate second side through a die attach adhesive layer.

24. The semiconductor package of claim 18, wherein said at least one flexible conductor is mechanically coupled to said substrate.

25. The semiconductor package of claim 18, wherein said at least one flexible conductor is wrapped around an edge of said substrate between said substrate first side and said substrate second side.

26. The semiconductor package of claim 18, further comprising multiple strips of flexible tape electrically coupling said semiconductor high-speed data interface to multiple electrical contacts at said substrate first side.

27. The semiconductor package of claim 18, wherein said flexible conductor comprises:
a flexible conductor first conductive layer electrically coupled to said semiconductor high-speed data interface and to said second electrical contact;
a flexible conductor second conductive layer configured to act as a ground plane; and
a flexible tape insulation layer separating said flexible conductor first conductive layer and said flexible conductor second conductive layer.

28. The semiconductor package of claim 18, wherein said high-speed signal travels at a frequency of 1 GHz or higher.

29. The semiconductor package of claim 18, wherein said flexible conductor comprises at least two flexible conductor conductive layers separated by a flexible conductor insulation layer.

30. The semiconductor package of claim 29, wherein at least one of said flexible conductor conductive layers is electrically coupled to said semiconductor high-speed data interface and to said second electrical contact.

31. The semiconductor package of claim 29, wherein at least one of said flexible conductor conductive layers acts as a ground plane.

32. A semiconductor package comprising:
a substrate having opposing first and second sides and defining a via extending at least partially there through;
first and second electrical contacts coupled to the first side of the substrate;
flexible tape extending from the first side of the substrate to the second side of the substrate, and electrically coupled to the first electrical contact;
a semiconductor device coupled to the second side of the substrate, where said semiconductor device includes a semiconductor low-speed data interface electrically coupled to the second electrical contact through the via, and a semiconductor high-speed data interface electrically coupled to the first electrical contact through the flexible tape and not through a via in said substrate.

33. The semiconductor package of claim 32, wherein said high-speed data interface and said flexible tape are configured to communicate data signals at a frequency of 1 GHz or higher.

34. A system for routing high-speed and low-speed signals, comprising:
a printed circuit board; and
one or more semiconductor packages electrically and mechanically coupled to said printed circuit board, wherein each of said one or more semiconductor packages comprise:
a substrate having opposing first and second sides and defining a via extending at least partially there through;
at least first and second electrical contacts coupled to the first side of the substrate;
flexible tape extending from the first side of the substrate to the second side of the substrate, and electrically coupled to the first electrical contact;
a semiconductor device coupled to the second side of the substrate, where said semiconductor device includes a semiconductor low-speed data interface electrically coupled to the second electrical contact through the via, and a semiconductor high-speed data interface electrically coupled to the first electrical contact through the flexible tape and not though a via in said substrate.

35. The system of claim 34, wherein said high-speed data interface and said flexible tape are configured to communicate data signals at a frequency of 1 GHz or higher.

36. A method for routing signals in a semiconductor package having a flexible conductor and multiple electrical contacts separated from a semiconductor device by a substrate that defines one or more vias at least partially there through, the method comprising:
routing low-speed signals from the semiconductor device to at least some of the electrical contacts through one or more of the vias; and
routing high-speed signals from the semiconductor device to at least some of the electrical contacts through the flexible conductor and not through one or more of the vias.

37. The method of claim 36, wherein the high-speed signals have a frequency of 1 GHz or higher.

38. A semiconductor package, comprising:
a substrate having a substrate first side and an opposing substrate second side wherein said substrate defines one or more vias extending at least partially there through;
multiple electrical contacts coupled to said substrate at said substrate first side;
a semiconductor device coupled to said substrate at said substrate second side;
at least one flexible conductor electrically coupled to said semiconductor device and to at least one of said electrical contacts; and
at least one lateral trace on said substrate at said substrate second side, wherein said lateral trace is electrically coupled to said semiconductor device and to said flexible conductor;
wherein said semiconductor device comprises at least one semiconductor low-speed data interface electrically coupled to at least one of said electrical contacts through at least one of said vias; and
wherein said semiconductor device further comprises at least one semiconductor high-speed data interface electrically coupled to said at least one flexible conductor through said lateral trace and not through a via.

39. The semiconductor package of claim 38, wherein said at least one semiconductor high-speed data interface, said at least one flexible conductor, and said lateral trace are configured to communicate data signals at a frequency of 1 GHz or higher.

40. A semiconductor package, comprising:
a rigid circuit board substrate having a substrate first side and an opposing substrate second side;
multiple electrical contacts coupled to said substrate at said substrate first side;
a semiconductor device in direct contact with said substrate at said substrate second side; and
at least one flexible conductor electrically coupled to a high-speed data interface of said semiconductor device and to at least one of said electrical contacts, wherein said flexible conductor forms a high-speed data signal path from said semiconductor high-speed data interface to said at least one of said electrical contacts without passing through a via in said rigid circuit board substrate.

41. The semiconductor package of claim 40, wherein said flexible conductor and said high-speed data signal path are configured to communicate data signals at a frequency of 1 GHz or higher.

42. The semiconductor package of claim 40, wherein the semiconductor device comprises a plurality of electrical connectors, and the plurality of electrical connectors is in direct contact with said substrate at said substrate second side.

43. The semiconductor package of claim 42, wherein said plurality of electrical connectors comprises a plurality of metal bumps.

44. The semiconductor package of claim 40, wherein said substrate defines one or more vias extending at least partially there through.

45. The semiconductor package of claim 44, wherein said semiconductor device comprises at least one semiconductor low-speed data interface electrically coupled to at least one of said electrical contacts through at least one of said vias.

46. A semiconductor package, comprising:
a rigid circuit board substrate having a substrate first side and an opposing substrate second side;
multiple electrical contacts coupled to said substrate at said substrate first side;
a semiconductor device in direct contact with said substrate at said substrate second side; and
at least one flexible conductor electrically coupled to said semiconductor device and to at least one of said electrical contacts, wherein said flexible conductor comprises:
a flexible conductor first conductive layer electrically coupled to a semiconductor high-speed data interface of said semiconductor device and to at least one of said electrically contacts;

a flexible conductor second conductive layer configured to act as a ground plane; and a flexible tape insulation layer separating said flexible conductor first conductive layer and said flexible conductor second conductive layer, wherein said flexible conductor forms a high-speed data signal path from said semiconductor high-speed data interface to said at least one of said electrical contacts without passing through a via in said rigid circuit board substrate.

47. The semiconductor package of claim 46, wherein said flexible conductor and said high-speed data signal path are configured to communicate data signals at a frequency of 1 GHz or higher.

48. A semiconductor package, comprising:
a substrate defining:
  a substrate first side and an opposing substrate second side; and
  at least one via extending at least partially through said substrate;
at least first and second electrical contacts coupled to said substrate at said substrate first side;
a semiconductor device coupled to said substrate at said substrate second side, wherein said semiconductor device comprises:
  a semiconductor low-speed data interface electrically coupled to said first electrical contact through said via; and
  a semiconductor high-speed data interface; and
flexible tape electrically coupling said semiconductor high-speed data interface to said second electrical contact;
wherein the semiconductor package is configure to route a low-speed signal between said substrate first side and said substrate second side through a conductive path comprising said via; and
wherein the semiconductor package is configure to route a high-speed signal between said substrate first side and said substrate second side through the flexible tape without passing through a via in the substrate.

49. The semiconductor package of claim 48, wherein said high-speed signal has frequency of 1 GHz or higher.

50. The semiconductor package of claim 48, wherein said flexible conductor comprises at least two flexible conductor conductive layers separated by a flexible conductor insulation layer.

51. The semiconductor package of claim 50, wherein at least one of said flexible conductor conductive layers is electrically coupled to said semiconductor high-speed data interface and to said second electrical contact.

52. The semiconductor package of claim 50, wherein at least one of said flexible conductor conductive layers acts as a ground plane.

53. A semiconductor package, comprising:
a rigid circuit board substrate having a substrate first side and an opposing substrate second side;
multiple electrical contacts coupled to said substrate at said substrate first side;
an adhesive in direct contact with said substrate second side;
a semiconductor device in direct contact with said adhesive; and
at least one flexible conductor electrically coupled to a first interface of said semiconductor device and to at least one of said electrical contacts so as to establish a data signal path for routing data signals at a frequency of at least 1 GHz from said semiconductor first interface to said at least one of said electrical contacts without passing through a via in said rigid circuit board substrate.

54. The semiconductor package of claim 53, further comprising at least one electrical trace on said substrate second side, where said semiconductor device and said at least one flexible conductor are electrically coupled to said at least one electrical trace through one or more wire bonds.

55. The semiconductor package of claim 53, wherein said semiconductor device is electrically coupled to said at least one flexible conductor through one or more wire bonds.

56. The semiconductor package of claim 53, wherein said substrate is a multi-layer laminate circuit board.

57. The semiconductor package of claim 53, wherein said substrate has a substrate first conductive layer at said substrate first side and a substrate second conductive layer at said substrate second side, where said substrate first conductive layer and said substrate second conductive layer are separated by a substrate insulation layer.

58. The semiconductor package of claim 53, wherein said electrical contacts comprise an array of solder balls, solder lands or pins.

59. The semiconductor package of claim 53, wherein said at least one flexible conductor is mechanically coupled to said substrate.

60. The semiconductor package of claim 53, wherein said at least one flexible conductor is wrapped around an edge of said substrate between said substrate first side and said substrate second side.

61. The semiconductor package of claim 53, wherein said at least one flexible conductor is flexible tape.

62. The semiconductor package of claim 53, wherein said substrate defines one or more vias extending at least partially through the substrate.

63. The semiconductor package of claim 62, wherein said semiconductor device comprises at least one semiconductor second interface electrically coupled to at least one of said electrical contacts through at least one of said vias so as to establish an additional data signal path for routing additional data signals at a frequency of less than 1 GHz from said semiconductor second interface to said at least one of said electrical contacts.

64. The semiconductor package of claim 53, wherein said flexible conductor comprises at least two flexible conductor conductive layers separated by a flexible conductor insulation layer.

65. The semiconductor package of claim 64, wherein at least one of said flexible conductor conductive layers is electrically coupled to said semiconductor device and to at least one of said electrical contacts.

66. The semiconductor package of claim 64, wherein at least one of said flexible conductor conductive layers acts as a ground plane.

* * * * *